United States Patent [19]

Smith et al.

[11] 4,343,832
[45] Aug. 10, 1982

[54] SEMICONDUCTOR DEVICES BY LASER ENHANCED DIFFUSION

[75] Inventors: James N. Smith, Tempe; Arthur D. Thompson, III, Scottsdale, both of Ariz.

[73] Assignee: Motorola, Inc., Schaumburg, Ill.

[21] Appl. No.: 193,235

[22] Filed: Oct. 2, 1980

[51] Int. Cl.³ .............................................. B05D 3/06
[52] U.S. Cl. ........................... 427/53.1; 219/121 LE; 219/121 LF; 427/85
[58] Field of Search ...................... 427/53.1, 85; 219/121 LE, 121 LF

[56] References Cited

U.S. PATENT DOCUMENTS

| | | | |
|---|---|---|---|
| 3,850,698 | 11/1974 | Mallozzi et al. | 219/121 LF |
| 4,015,100 | 3/1977 | Gnanamuthu et al. | 219/121 LF |
| 4,059,461 | 11/1977 | Fan et al. | 427/53.1 |
| 4,122,240 | 10/1978 | Banas et al. | 219/121 LE |
| 4,243,433 | 1/1981 | Gibbons | 219/121 LF |

OTHER PUBLICATIONS

Affolter et al., "Applied Phys. Let.", V33, No. 2, p. 185, Jul. 1978.
Margalit et al., "Applied Phys. Let.", V33, No. 4, p. 346, Aug. 1978.
Kaplan et al., "Journ. Electro Chem. Soc.", V126, No. 8, Aug. 1979, Abst. No. 503, p. 3616.

*Primary Examiner*—John H. Newsome
*Attorney, Agent, or Firm*—Robert M. Handy

[57] ABSTRACT

A process is described for the doping of semiconductors utilizing laser beam melting of the semiconductor surface in the presence of a dopant source. By selecting the laser wavelength to satisfy one of several criteria relating the semiconductor absorption coefficient and wafer thickness, or the dopant thickness and doping depth, the heating and melting are constrained to occur in a small local region near the surface where the laser beam impinges. Use of this invention to produce Zener diodes having abrupt doping profiles, as well as other device structures, is also discussed.

11 Claims, 8 Drawing Figures

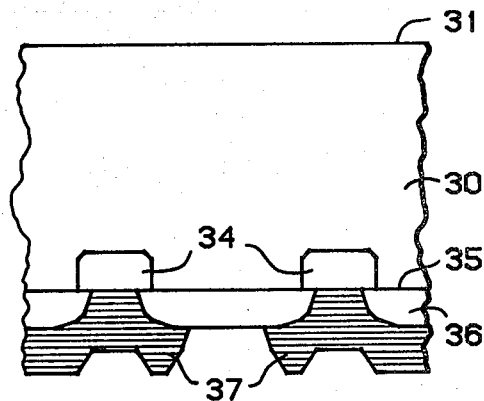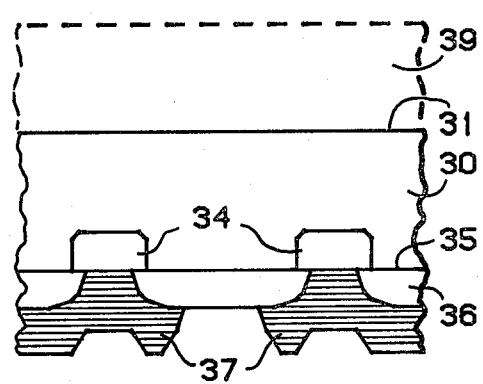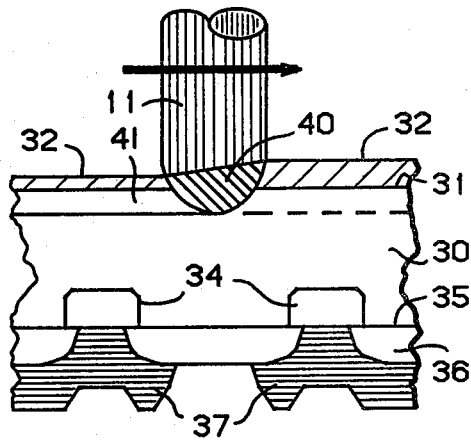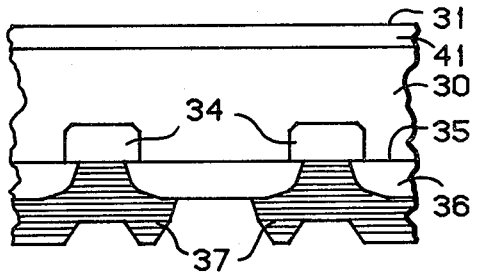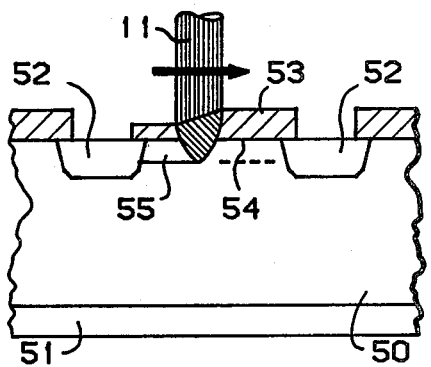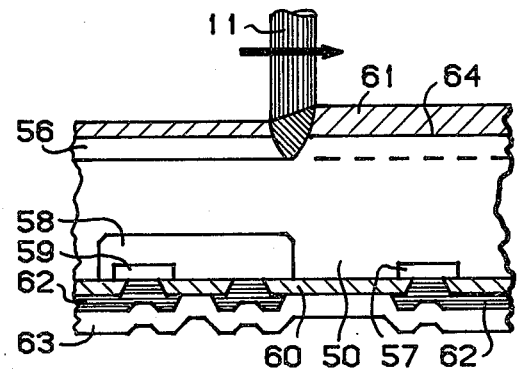

SEMICONDUCTOR DEVICES BY LASER ENHANCED DIFFUSION

This invention relates to a method for low temperature doping of semiconductors. More specifically, the invention relates to the use of pulsed lasers as a localized short duration heat source in connection with dopant source materials such as doped glasses of appropriate thickness and composition to achieve high concentration abrupt doping of thin surface layers of a semiconductor while the average temperature of the semiconductor remains near its initial ambient temperature.

The fabrication of most semiconductor devices requires a complex sequence of steps. These steps can be divided into two broad classes: (1) high temperature (900°–1200° C.) steps such as epitaxy, doping, diffusion, oxidation, annealing, alloying or sintering; and (2) low temperature (room temperature—350°) operations such as ion implantation, lapping, polishing, photomasking, etching, metallization, and protective coating. The usual rule is that no low temperature material such as a photoresist, metallization, or protective coating can be present on the semiconductor during a high temperature processing step. As a consequence, it has been traditional to reserve the metallization and protective coating operations to the end of the process sequence after all the high temperature operations have been completed.

This restriction creates problems which are of increasing importance in current semiconductor device fabrication. Certain device designs require that the semiconductor body be relatively thin for proper operation, e.g. 5–10 mils (0.013–0.025 cm) between the two major faces. With wafer diameters of approximately 2 inches (5.1 cm), breakage during processing was not a severe problem even with the thin wafers required. However, modern practice is to utilize wafers of approximately 4 inches (10.2 cm) or larger diameter which results in unacceptable breakage if thin wafers are used. To avoid this, 20–25 mils (0.051–0.064 cm) thick wafers are typically employed and then thinned by lapping and polishing the required thickness just prior to completion. Once the wafers have been thinned, subsequent handling must be minimized. Thus, part or all of the metallization and protective coatings are desired to be applied and patterned prior to the thinning operations.

In certain classes of devices, it is essential to dope the semiconductor after the thinning operation is complete. For example, where current flow is substantially through the device from one major face to the other and the series resistance of the back side contact is an important factor in device performance, it is desired to dope the rear face. This step can only be performed after the thinning operation. Since the normal low temperature metallization and protective coating may already be in place, there is need for a doping technique which does not significantly raise the average wafer temperature above the ambient.

Another area of need has been to form very abrupt doped regions of well controlled properties. Heretofore, only alloying produced abrupt transitions approaching theoretical performance, but this technique is of limited utility because it is poorly adapted to many device configurations and is very sensitive to surface imperfections.

There have been a number of attempts to circumvent the problem. Refractory metallization and protective coating materials capable of withstanding high temperature exist which permit high temperature doping techniques to be used. However, this approach suffers from several drawbacks which render it impractical for many applications, e.g. the refractory metallization and protective coatings are expensive and difficult to produce, the high temperature operations required for their formation generally result in lower yields and, in thin wafers, the final high temperature doping step can cause severe thermal stress and increased breakage.

Another attempted solution has been to use ion implantation as a means for low temperature doping. While this technique can provide effective doping at temperatures substantially below normal diffusion temperatures, and has proved very useful in many instances, it has not provided a practical answer to the problems discussed here for several reasons, e.g. a post implant thermal anneal in the range 700°–900° C. is normally required, which exceeds the temperature limits of desirable low temperature metallization and protective coatings, and ion implantation equipment is relatively expensive and of limited throughput at the high doping level needed, so that the cost per wafer treated is likely to be higher.

Lasers have recently been shown to be potentially useful tools for ion implant annealing and also for direct doping of semiconductor surfaces by locally melting the surface of a semiconductor in contact with a dopant source. It is known that powerful lasers can be used to melt very thin local regions at the semiconductor surface and that the molten zone can rapidly refreeze as single crystal material homogeneous with the bulk. Laser melting of semiconductor surfaces has been shown to give abrupt n+p junctions. However, surface damage, internal stress effects, cracking, and anomolous results noted in the prior art make design or preparation of commercially useful structures based on this art heretofore impractical. In short, while the general concepts are described by the prior art, the actual conditions and methods needed to deal with practical problems, such as those described here, have not been known nor has it been obvious that damage to temperature sensitive surface layers could be avoided. Further discovery was required.

Accordingly, a need existed to develop a method for the low temperature doping of semiconductors and for the achievement of abrupt doping regions which would overcome the problems inherent in the prior art apparatus and methods.

It is therefore an object of this invention to provide a method for low temperature doping of semiconductors.

It is further an object of this invention to provide a method for high concentration doping of semiconductors at low temperatures.

It is another object of this invention to provide a method for high concentration doping of semiconductors in the presence of metallization, insulators and/or protective coatings which cannot tolerate high temperature.

It is a still further object of this invention to provide very abrupt doped regions of controlled and superior properties in a semiconductor.

SUMMARY OF THE INVENTION

The attainment of the foregoing and other objectives and advantages of the invention is achieved through the present invention, wherein a semiconductor wafer, having on its surface one or more temperature sensitive layers such as low temperature metallization, insulators and/or protective coating, is further doped without significant heating of the whole wafer. A laser melts selective regions of the semiconductor wafer surface in the presence of an appropriate dopant source. The melting process in accordance with parameters hereinafter described avoids cracking, boiling, or spattering of either wafer surface and permits rapid epitaxial refreezing of the melt, producing a doped layer or region homogeneous with the bulk, free of significant structural damage, and having an abrupt transitions of doping concentration.

BRIEF DESCRIPTION OF THE DRAWINGS

FIG. 1 is a schematic view of a portion of a semiconductor wafer showing different stages in an embodiment of the method of this invention.

FIG. 4 is a schematic view of a portion of a semiconductor wafer showing additional embodiments of this invention.

DETAILED DESCRIPTION OF THE PREFERRED EMBODIMENTS

Figure 2:
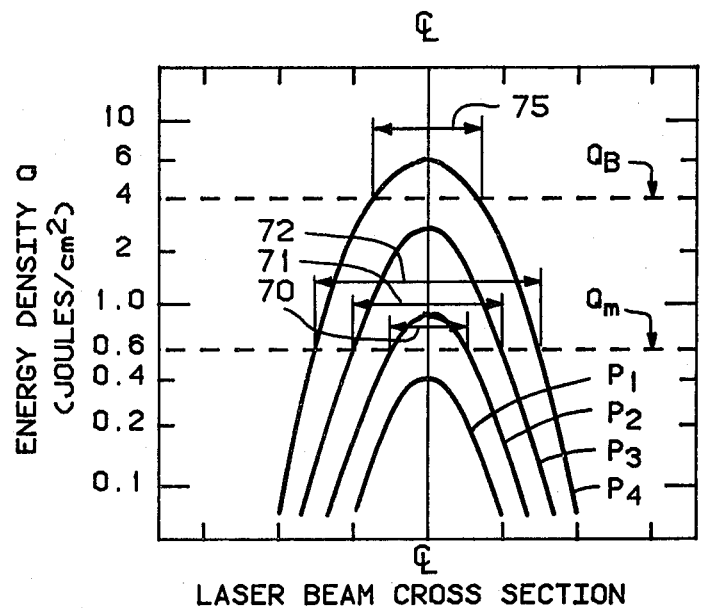
FIG. 2 is a schematic representation of the energy density cross section of the laser beam for different laser power levels $P_1 < P_2 < P_3 < P_4$.

In the practice of this invention a semiconductor, typically a wafer of silicon, has applied to it a dopant source material and is then irradiated by a laser beam focussed or projected into a small spot on the surface of the wafer. The laser energy is adjusted so that the semiconductor surface immediately beneath the spot where the laser impinges melts together with the dopant source, but does not boil. The laser beam and the semiconductor are moved relative to each other so that newly illuminated regions melt while previously illuminated regions rapidly refreeze, generally epitaxially, with the underlying semiconductor crystal. The depth of the melted region determines substantially the depth of the resulting doped region and is generally desired to be a small fraction of the semiconductor wafer thickness.

Selection of proper operating conditions for the laser is a complex function of the properties of the laser, the semiconductor, the device structure and materials that are already present in or on the semiconductor, and the dopant source material and thickness. The primary requirement is that the proper amount of laser energy be absorbed by the semiconductor-dopant source combination as close as possible to the site being irradiated and away from other regions or surfaces which may have temperature sensitive materials thereon. It is important that the laser energy be absorbed in the region of interest, rather than being transmitted through the silicon where it may escape as lost energy or be absorbed by other regions on the opposite face, such as highly doped surface layers or low temperature metallization, insulators or protective coatings and cause damage therein.

To simplify discussion, "impinging face" is used to designate the major surface of the semiconductor wafer on which the laser impinges, and "opposite face," the opposing major face. Similarly, "front face" designates that major surface of the wafer on which device structures have been formed prior to laser irradiation and "rear face" the opposing major face. The laser may impinge on either the front face or rear face or both depending on the application. The interaction of the laser beam light with the semiconductor is examined first, the effect of the dopant source material is considered later.

It can be shown that criteria for selection of laser wavelengths in accordance with the present invention take into account differing semiconductor properties and different wafer thicknesses, that is, that the product of the absorption coefficient $\alpha$ and semiconductor wafer thickness L exceed certain values depending on the structure, as follows:

(1) For substantially homogeneously doped semiconductor structures, choose laser wavelength so that the condition $\alpha L > 5$ is satisfied.

(2) For layered semiconductor structures wherein the laser light enters first a lightly doped region where $\alpha = \alpha_1$, then a heavily doped region adjacent to the opposite face where $\alpha = \alpha_2$, choose laser wavelength so that the condition $\alpha_1 L > 5 + \ln(\alpha_2/\alpha_1)$ is satisfied for $\alpha_2 > \alpha_1$ or $\alpha_1 L > 5$ for $\alpha_1 \leq \alpha_2$.

Since $\alpha$ depends on temperature the values used herein should correspond to the initial (starting) ambient temperature of the semiconductor before laser beam heating is initiated. This will be room temperature in most cases.

The first condition assures that less than 1% of the entering energy will reach the opposite face. For a 10 mil (0.025 cm) wafer this gives $\alpha > (5/L) = 200$ which from the known relation between $\alpha$ and $\lambda$ for silicon indicates that $\lambda$ should be less than approximately 0.95 microns.

The second condition is more stringent and insures that the initial energy absorbed in a region of width $\Delta$ adjacent to the opposite face, e.g. surface 35 of FIG. 1, is less than 1% of the energy absorbed in the same width $\Delta$ adjacent to the impinging face, e.g. surface 31 of FIG. 1. For silicon, $\alpha_2/\alpha_1 \leq 100$ satisfies most cases of practical interest giving $5 + \ln(\alpha_2/\alpha_1) = 9.6$. Thus for wafers of approximately 10 mils (0.025 cm) thickness one has $\alpha_1 L > 9.6$ or $\alpha_1 \leq 384$, which from the known relation between $\alpha$ and $\lambda$ for silicon indicates that $\lambda$ should be less than approximately 0.9 microns.

Examples of the known relationship between the absorption coefficient and wavelength for particular silicon materials and experimental conditions are provided by W. R. Runyon in *Silicon Semiconductor Technology*, McGraw-Hill, N.Y., 1965, chapter 9, pages 187–212 and figures therein. Numerous other references are available in the technical literature. Measurements of the relationship between the absorption coefficient and wavelength have also been made for most other semiconductor materials of interest and are readily found in the technical literature. For example, data on germanium are given by L. V. Azaroff, *Introduction to Solids*, McGraw-Hill, N.Y., 1960, page 331, and data on III–V compounds are given by O. Madelung et al., *Physics of III–V Compounds*, J. Wiley and Sons, N.Y., 1964, chapter 3. Techniques for making such measurements are also well known in the art.

An alternative criterion for selecting the laser beam wavelength is in terms of the combination of the thickness t of the dopant source layer and the thickness d of the region in the semicondutor wherein doping is desired, t and d being measured perpendicular to the semiconductor surface. Doping is accomplished primarily by melting of the semiconductor and the dopant source and dissolution of the dopant from the source into the semiconductor. Thus a region of thickness (d+t) is desired to be melted with as little heat coupling as possible to the body of the semiconductor. This is accomplished by choosing $\lambda$ so that a large part, for example, greater than approximately 90% of the laser beam energy is initially absorbed in a region whose thickness D is at most a small multiple of (d+t), that is $D \leq n(t+d)$ where n is less than about 10. Since $D<<L$ in the cases of interest, applying this criterion insures that no significant laser beam energy will be coupled to the opposite face of the wafer. Applying this to silicon with (d+t)=2 microns, and again using the known relation between $\alpha$ and $\lambda$ indicates that $\lambda$ should be less than approximately 0.8 microns, a slightly more conservative limit than presented earlier. The chosen wavelength of $\lambda=0.532$ microns falls well within the general criteria established for silicon and is convenient from the point of view of available laser generators.

FIG. 1 illustrates a preferred embodiment of the invention to achieve low temperature rear face enhancement doping. An N-type silicon semiconductor wafer 30 of FIG. 1A containing p+ doped regions 34 with insulating layers 36 and low temperature metal layers 37 on the front face 35 is lapped and polished on rear face 31 to remove portion 39 of the wafer so as to bring it substantially to its final thickness in FIG. 1B. The foregoing steps and materials are well known in the art per se and the details need not be repeated here.

An n+ dopant soure 32 is applied to rear face 31. Laser beam 11 is applied (FIG. 1C) producing shallow molten zone 40 made up of silicon from the wafer and dopant material from the dopant source which is also molten under the beam. Molten zone 40 is scanned over the area of surface 31 which is desired to be doped by providing relative motion between laser beam 11 and wafer 30. As the beam moves on, the previous molten regions solidify rapidly (estimated solidification time $10^{-3}-10^{-6}$ sec), the silicon freezing epitaxially on the underlying single crystal so as to produce an essentially single crystal surface region 41 now substantially saturated with dopant atoms derived by dissolution from dopant source 32. The heating and freezing process is so rapid and localized that little total energy is imparted to the wafer. Front face 35, containing the temperature sensitive layers, remains sufficiently near room temperature so that no damage occurs. With laser wavelength $\lambda=0.532$ microns, the average temperature rise $(T-T_A)$ of the whole wafer is estimated to be less than 10° C. above the initial ambient temperature $T_A$, which in this case is room temperature. The freezing process is also so rapid that there is essentially little opportunity for the impurities to diffuse into the bulk of the wafer. Thus a sharp discontinuity in doping density is obtained at substantially the edge of what was the molten zone. Following laser melting, doping and refreezing of rear surface 31, the wafer (FIG. 1D) is etched to remove residual dopant source material 32 and processing, testing and assembly completed, by standard steps well known per se in the art.

Several trials were made according to the above description using a laser of wavelength $\lambda=1.06$ microns impinging on the rear face of the wafer. At this wavelength sufficient laser energy passed through the wafer to cause blistering or destructive separation of the front side metal. These observations are consistent with the criteria presented earlier in that $\lambda=1.06$ is outside the boundary obtained from the criterion $\alpha L>5$ or $\alpha_1 L=5+\ln(\alpha_2/\alpha_1)$ for the silicon samples used. A convenient laser wavelength which satisfies the criteria is $\lambda=0.532$ obtained by using a frequency doubler in the output of a $\lambda=1.06\mu$ laser. No front side metal damage was encountered at $\lambda=0.532$, again consistent with the criteria.

Typical operating conditions according to the above embodiment are as follows:
Laser: Q-switched, YAG, $\lambda=0.532$ microns
Average power: 0.8 watts
Energy density: 0.64–1.5 Joules/cm$^2$
Q-switch pulse frequency: 5 kilohertz
Q-switch pulse duration: 50–100 nanoseconds
Spot size: 100 microns (0.0001 cm)
Radial an Rotative Deflection Step Size: 2 mils (0.0051 cm)

The laser power output was empirically adjusted to give local melting without boiling or spattering of the semiconductor surface or other damage. It has been observed that there is a laser beam energy density threshold $Q_m$ (called the melting threshold) above which melting takes place. This threshold depends on the laser beam characteristics, the dopant source characteristics, and the semiconductor characteristics, and can be determined experimentally for any laser-dopant-source-semiconductor combination. See FIG. 2 for silicon and Q switched YAG at $\lambda$-0.532 operating at approximately 50% overlap and 80 nanosecond pulses at 5 kilohertz repetition rate wherein $Q_m$ was found to be approximately 0.6 Joules/cm$^2$. Below $Q_m$ the laser beam pulse is absorbed without causing melting. Above $Q_m$ the surface melts, and as the energy density is raised, the volume and temperature of the local melted region increase. This is illustrated in FIG. 2 which shows schematically the laser beam energy density profile through a cross section of the beam for different total beam power levels $P_1<P_2<P_3<P_4$. As total laser beam power is increased, a larger portion of the beam cross section exceeds $Q_m$, and the melt diameter increases (see 70, 71, 72 of FIG. 2). There is a second higher threshold $Q_B$ above which a portion of the surface, corresponding to 75 of FIG. 2, reaches the boiling point wherein the vapor pressure of the semiconductor is believed to be appreciable compared to atmospheric pressure and significant semiconductor material vaporize to cause cratering and pitting of the semiconductor surface, or there is internal damage after refreezing. For the silicon samples used $Q_B$ was found to be approximately four Joules/cm$^2$. The laser beam power is adjusted so that the energy density Q lies between the two extremes, that is $Q_m<Q<Q_B$. Within this range, the higher the power the greater the depth d of the melted region and the greater the throughput, that is, the area of semiconductor surface melted and doped per unit time.

If the dopant source has a higher vapor pressure than the semiconductor, there can be loss of dopant source material by evaporation at energy densities below $Q_B$. This can be tolerated provided the amount remaining is adequate to provide the desired doping.

The preferred dopant source material was found to be spun-on dopant glass containing the appropriate n or p-type impurity atom, as may be prepared according to the teachings of K. Ritchie, U.S. Pat. No. 3,789,023. Typical conditions for applying an n-type dopant were as follows:
Dopant Source: Arsenic spin-on glass Spin Speed: 4,000 rpm
Spin Time: 10 sec
Bake: 150°–400° C.

Using the above laser and dopant parameters typically yielded doped regions in the silicon wafers having depths of 0.25 to 0.70 microns and sheet resistance of 70–400 ohms per square. It was observed that some dopant source material was lost during the laser melting and doping process, in that the amount of dopant glass remaining on the surface after refreezing was less than initially applied. This did not appear to adversely affect the results.

Zener diodes were constructed according to the method described above. Improved forward voltage drop $V_F$ and standard deviation $\sigma$ were obtained as shown by the following table for values of forward current $I_F$ from 200 to 5000 milliamperes and laser power densities of 0.64 to 1.5 Joules/cm$^2$. Typical values for standard product representative of the prior art are used as reference. The smaller standard deviation compared to the standard product indicates improved doping uniformity.

ZENER FORWARD VOLTAGE DROP $V_F$ AT DIFFERENT FORWARD CURRENTS $I_F$ FOR VARIOUS LASER ENERGY DENSITIES

| FORWARD CURRENT | | | | | | | |
|---|---|---|---|---|---|---|---|
| $I_F =$ | 200 | 500 | 1000 | 2000 | 3000 | 5000 | milliamps |
| STANDARD PRODUCT | | | | | | | |
| $V_F =$ | 891 | 1003 | 1138 | 1340 | 1520 | 1840 | millivolts |
| $\sigma =$ | 11 | 22 | 38 | 70 | 90 | 130 | millivolts |
| LASER PRODUCT AT | | | | | | | |
| 1.50 Joules/cm$^2$ | | | | | | | |
| $V_F =$ | 889 | 898 | 1102 | 1270 | 1420 | 1660 | millivolts |
| $\sigma =$ | 7 | 13 | 18 | 30 | 40 | 40 | millivolts |
| 1.20 Joules/cm$^2$ | | | | | | | |
| $V_F =$ | 892 | 1002 | 1132 | 1320 | 1490 | 1780 | millivolts |
| $\sigma =$ | 5 | 5 | 15 | 20 | 30 | 40 | millivolts |
| 0.96 Joules/cm$^2$ | | | | | | | |
| $V_F =$ | 898 | 1017 | 1144 | 1340 | 1500 | 1800 | millivolts |
| $\sigma =$ | 5 | 10 | 13 | 20 | 20 | 30 | millivolts |
| 0.64 Joules/cm$^2$ | | | | | | | |
| $V_F =$ | 899 | 1018 | 1148 | 1350 | 1510 | 1800 | millivolts |
| $\sigma =$ | 17 | 21 | 28 | 40 | 50 | 70 | millivolts |

Figure 3:
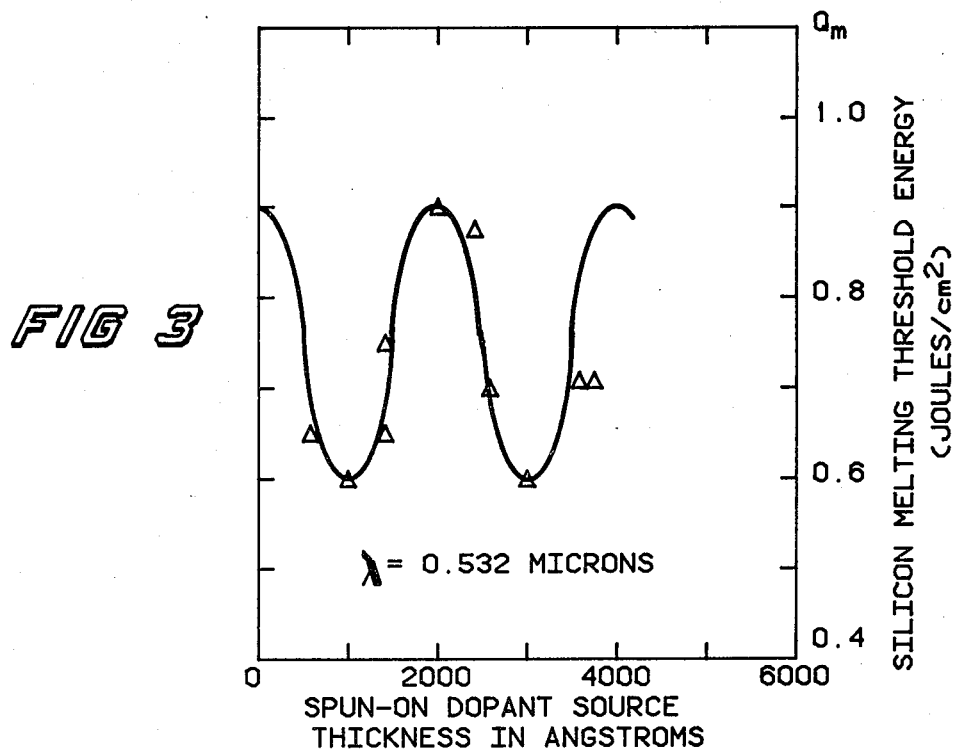
FIG. 3 is a plot of experimental data (points) and theoretical data (solid line) for the silicon melting threshold energy $Q_m$ as a function of dopant thickness.

In other experiments various thicknesses of spun-on dopant glasses from approximately 200–4000 Angstroms were used with varying results. Since the spun-on dopant glass has an index of refraction of approximately N=1.4 intermediate of air and silicon, it acts incidentally as an antireflection coating decreasing the reflection coefficient R. Thus it acts to improve the coupling of laser energy into the silicon, an effect well known in the art. In the thickness range of interest, the spun-on dopant glass also acts as an interference coating, an effect well known in the art, so that maxima and minima are observed in the laser energy required to achieve melting as a function of layer thickness for fixed laser wavelength. This is illustrated in FIG. 3 where the points are experimental data and the solid line the theoretical curve for N=1.4 and $\lambda$=0.532 microns. Based on classical optical theory one would ordinarily choose to operate at dopant thicknesses t corresponding to the minima of the curve in FIG. 3 (t=950, 2850, 4750, etc., Angstroms) and avoid the maximum (t=1900, 3800, etc., Angstroms). Additionally, the spun-on dopant glass layer thickness is ordinarily adjusted to control the doping density, and based on prior art, the thicker the glass the lower the sheet resistance of the resulting doped layers. It has been discovered that these prior art relationships are not useful in the present invention, and that there is a monotonic decrease in doped layer sheet resistance with decreasing spun-on dopant layer thickness in the range t<2000 Angstrom units, preferably in the range $200 \leq t \leq 1000$ Angstrom units.

FIG. 4A illustrates an embodiment of the invention in which an N-type semiconductor wafer 50 contains p+ doped regions 52 and n+ doped region 51 which may be produced by conventional means well known per se in the art or alternatively by the method of this invention and with doped oxide source glass 53 covering front surface 54 on which laser beam 11 impinges on the front face so as to produce abrupt p+ junction region 55 spanning conventional junction region 52. The p+/n$^-$ junction produced in this fashion will be abrupt compared to a conventional diffused junction or ion implanted junction because of the very rapid melting, mixing, and refreezing of the silicon-dopant combination using the laser, and the lower average wafer temperature. The relative abruptness of the junction compared to diffused or ion implanted junctions distinguishes the products made by this process as compared to those made by the alternative processes. This property is independent of whether the doping transition is p+/n, n+/p, p+/p, n+/n, p+/n+ or intermediate combinations.

FIG. 4B illustrates an embodiment in which an N-type semiconductor wafer 50 containing p doped regions 57 and 58 and n+ doped region 59 in the front face with p+ dopant glass 61 on the rear face, all well known in the art per se, is illuminated on the rear face by laser beam 11 so as to produce p+ region 56 in rear face 64 without thermal damage to front face insulator 60, metal 62, or protective coating 63.

Thus it is apparent that there has been provided in accordance with the invention means and structures for low temperature doping of semiconductors, for high concentration doping of semiconductors at low temperatures, for doping of semiconductors in the presence of pre-existing materials and structures on the semiconductor wafer which are temperature sensitive, and in some cases susceptible to damage when otherwise heated significantly above a few tens or few hundred degrees centigrade, and also for obtaining abrupt junctions of superior properties within semiconductors. While the invention has been described in terms of various examples, it will be obvious to those skilled in the art that the invention is useful with other geometries, dopants, conductivity type, materials, and structures which may differ in detail but preserve the essential relationships among laser parameters, material parameters, device structure and desired doping region. Accordingly, it is intended to encompass all such variations as fall within the scope of the appended claims.

We claim:

1. A process utilizing a laser beam of wavelength $\lambda$ for doping a region of area A and depth d, wherein d is measured perpendicular to A, in a semiconductor body while the average temperature T of said semiconductor body during doping remains within a small range T−$T_A$ of initial ambient temperature $T_A$ of said semiconductor body, comprising the steps of:

forming a dopant source of thickness t on said semiconductor body, wherein $t \leq d$ and said dopant source and semiconductor body form a combination;

choosing said wavelength λ so that at said ambient temperature $T_A$, more than 90% of the energy of said laser beam is absorbed within said combination in a depth $D \leq n(t+d)$ where $n \leq 10$, and D is measured perpendicular to A from an exterior surface of said dopant source means;

placing said combination in a path of said laser beam;

energizing said laser beam to an energy density Q which exceeds a melting threshold $Q_m$ but is less than a boiling threshold $Q_B$ so as to melt a small local surface region of said combination substantially immediately beneath a spot within area A where said laser beam impinges on said combination so that the depth of melting in said semiconductor body corresponds substantially to d;

moving said combination and said laser beam relative to each other so that other small local surface regions newly illuminated by said laser beam are successively melted, and local surface regions no longer illuminated successively refreeze;

continuing until substantially the entire area A has been melted and refrozen.

2. A process utilizing a laser beam of wavelength λ for doping a region of area A and depth d, wherein d is measured perpendicular to A, in a semiconductor body while the average temperature T of said semiconductor body during doping remains within a small range $T-T_A$ of initial ambient temperature $T_A$ of said semiconductor body, comprising the steps of:

forming a dopant source of thickness t on said semiconductor body, wherein $t \leq d$, and said dopant source and semiconductor body form a combination;

choosing said wavelength λ so that $\alpha L > 5$ wherein α is the absorption coefficient at said initial ambient temperature $T_A$ and L is the thickness of said semiconductor body, L being measured in the direction traversed by said laser beam;

placing said combination in a path of said laser beam;

energizing said laser beam to an energy density Q which exceeds a melting threshold $Q_m$ but is less than a boiling threshold $Q_B$ so as to melt a small local surface region of said combination substantially immediately beneath a spot within area A where said laser beam impinges on said combination so that the depth of melting in said semiconductor body corresponds substantially to d;

moving said combination and said laser beam relative to each other so that other small local surface regions newly illuminated by said laser beam are successively melted; and local surface regions no longer illuminated successively refreeze;

continuing until substantially the entire area A has been melted and refrozen.

3. A process utilizing a laser beam of wavelength λ for doping a region of area A and depth d, wherein d is measured perpendicular to A, in a semiconductor body while the average temperature T of said semiconductor body during doping remains within a small range $T-T_A$ of initial ambient temperature $T_A$ of said semiconductor body, comprising the steps of:

forming a dopant source of thickness t on said semiconductor body, wherein $t \leq d$, and said dopant source and semiconductor body form a combination;

choosing said wavelength λ so that $\alpha_1 L > 5 + \ln(\alpha_2/\alpha_1)$ for $\alpha_2 > \alpha_1$ and $\alpha_1 L > 5$ for $\alpha_2 \leq \alpha_1$, wherein $\alpha_1$ is the absorption coefficient at said initial ambient temperature $T_A$ of a first region of said semiconductor body of first conductivity, first encountered by said laser beam, and $\alpha_2$ is the absorption coefficient at said initial ambient temperature $T_A$ of a second region of said semiconductor body of second conductivity, next encountered by said laser beam on passing through said first region, and L is the thickness of said semiconductor body measured in the direction traversed by said laser beam;

placing said combination in a path of said laser beam;

energizing said laser beam to an energy density Q which exceeds a melting threshold $Q_m$ but is less than a boiling threshold $Q_B$ so as to melt a small local surface region of said combination substantially immediately beneath a spot within area A where said laser beam impinges on said combination so that the depth of melting in said semiconductor body corresponds substantially to d;

moving said combination and said laser beam relative to each other so that other small local surface regions newly illuminated by said laser beam are successively melted; and local surface regions no longer illuminated successively refreeze;

continuing until substantially the entire area A has been melted and refrozen.

4. The process of claim 1 or 2 or 3 wherein said refreezing step takes place in substantially $10^{-3}$ to $10^{-6}$ seconds and substantially epitaxially with said semiconductor body.

5. The process of claim 1 or 2 or 3 wherein said semiconductor body is silicon.

6. The process of claim 5 wherein said forming step comprises spinning a doped glass onto said semiconductor body and thereafter baking at a predetermined temperature, said doped glass being the dopant source.

7. The process of claim 5 wherein the said average temperature T is less than 400° C.

8. The process of claim 1 wherein said semiconductor body is silicon and the wavelength of said laser beam is less than 0.8 microns.

9. The process of claim 2 wherein said semiconductor body is silicon and the wavelength of said laser beam is less than 0.95 microns.

10. The process of claim 3 wherein said semiconductor body is silicon and the wavelength of said laser beam is less than 0.9 microns.

11. The product formed by the process set forth in claim 1, 2, or 3.

* * * * *